United States Patent [19]
Weiner

[11] Patent Number: 5,773,309
[45] Date of Patent: Jun. 30, 1998

[54] METHOD FOR PRODUCING SILICON THIN-FILM TRANSISTORS WITH ENHANCED FORWARD CURRENT DRIVE

[75] Inventor: Kurt H. Weiner, San Jose, Calif.

[73] Assignee: The Regents of the University of California, Oakland, Calif.

[21] Appl. No.: 511,937

[22] Filed: Aug. 7, 1995

Related U.S. Application Data

[63] Continuation of Ser. No. 323,308, Oct. 14, 1994, abandoned.

[51] Int. Cl.⁶ .................................................. H01L 21/268
[52] U.S. Cl. ............................ 437/21; 437/40; 437/174; 117/8; 117/904; 148/DIG. 90
[58] Field of Search ............................... 437/21, 40 TFT, 437/41 TFT, 907, 908, 173, 174; 117/4, 8, 9, 10, 44, 43, 904; 148/DIG. 90–DIG. 93

[56] References Cited

U.S. PATENT DOCUMENTS

| | | |
|---|---|---|
| 4,404,735 | 9/1983 | Sakurai . |
| 4,502,204 | 3/1985 | Togashi et al. . |
| 4,697,333 | 10/1987 | Nakahara ........................ 148/DIG. 61 |
| 4,851,363 | 7/1989 | Troxell et al. ............................. 437/40 |
| 5,210,766 | 5/1993 | Wines et al. ............................... 257/52 |
| 5,254,208 | 10/1993 | Zhang ....................................... 437/21 |
| 5,264,383 | 11/1993 | Young ....................................... 437/40 |
| 5,272,361 | 12/1993 | Yamazaki .................................. 257/66 |
| 5,313,076 | 5/1994 | Yamazaki et al. ........................ 257/66 |
| 5,346,850 | 9/1994 | Kaschmitter et al. ................... 437/173 |
| 5,523,587 | 6/1996 | Kwo ......................................... 257/64 |

FOREIGN PATENT DOCUMENTS

| | | | |
|---|---|---|---|
| 523768A2 | 1/1993 | European Pat. Off. ................. 437/40 |
| 62-98774 | 5/1987 | Japan . |
| 62-286282 | 12/1987 | Japan . |
| 1-76715 | 3/1989 | Japan . |
| 2-94624 | 4/1990 | Japan . |
| 2-130912 | 5/1990 | Japan ..................................... 437/173 |
| 4-11722 | 1/1992 | Japan . |
| 5-226656 | 9/1993 | Japan . |

OTHER PUBLICATIONS

T.W. Little, et al., Jpn. J. Appl. Phys., 30(12B)(1991)3724, "Low temperature TFTs . . . very thin films . . . ", Dec. 1991.
Translation of JP 4–11722.

Primary Examiner—Charles L. Bowers, Jr.
Assistant Examiner—Leon Radomsky
Attorney, Agent, or Firm—L. E. Carnahan; Henry P. Sartorio

[57] ABSTRACT

A method for fabricating amorphous silicon thin film transistors (TFTs) with a polycrystalline silicon surface channel region for enhanced forward current drive. The method is particularly adapted for producing top-gate silicon TFTs which have the advantages of both amorphous and polycrystalline silicon TFTs, but without problem of leakage current of polycrystalline silicon TFTs. This is accomplished by selectively crystallizing a selected region of the amorphous silicon, using a pulsed excimer laser, to create a thin polycrystalline silicon layer at the silicon/gate-insulator surface. The thus created polysilicon layer has an increased mobility compared to the amorphous silicon during forward device operation so that increased drive currents are achieved. In reverse operation the polysilicon layer is relatively thin compared to the amorphous silicon, so that the transistor exhibits the low leakage currents inherent to amorphous silicon. A device made by this method can be used, for example, as a pixel switch in an active-matrix liquid crystal display to improve display refresh rates.

13 Claims, 1 Drawing Sheet

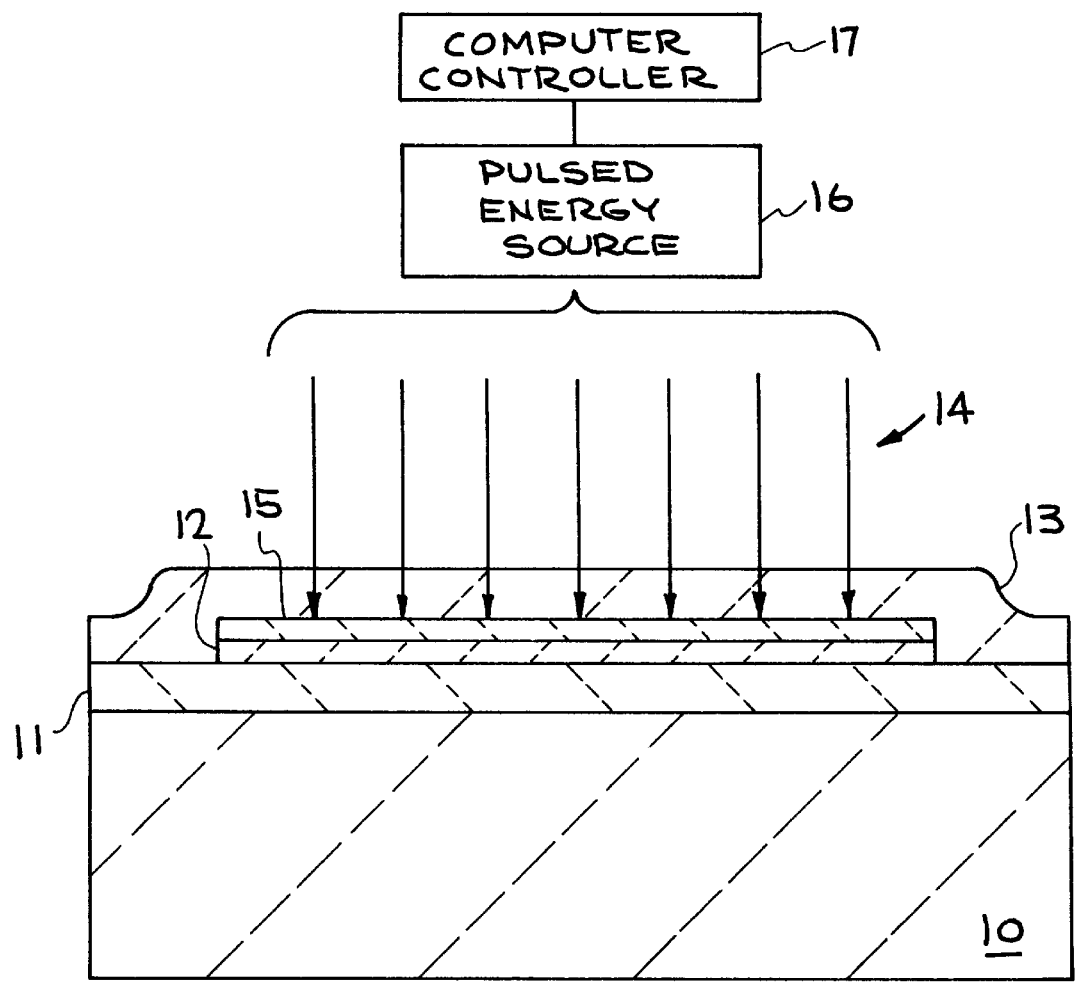

METHOD FOR PRODUCING SILICON THIN-FILM TRANSISTORS WITH ENHANCED FORWARD CURRENT DRIVE

This is a Continuation of application Ser. No. 08/323,308 filed Oct. 14, 1994, abandoned.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to silicon thin-film transistors (TFTs), particularly to a method for fabricating amorphous silicon TFTs with enhanced forward current drive, and more particularly to a method for modifying amorphous silicon TFTs to produce a polycrystalline silicon surface channel region in the amorphous silicon by pulsed energy processing.

In recent years substantial effort has been directed to the development and manufacture of flat panel displays. Currently, flat panel displays represent a 5–6 billion dollar industry and is expected to reach 20 billion dollars by the turn of the century. Among the emerging technologies for flat panel displays, the active matrix-liquid crystal display (AM-LCD) is predicted to dominate in the coming years. The differentiator between AM-LCDs and other types of flat panel displays is the use of a thin-film transistor (TFI) switch at each pixel. By incorporating such a transistor, superior contrast and viewing angle is achieved.

Currently, the active matrix transistors are fabricated in amorphous silicon. This material is ideal because of its low cost, low reverse leakage current, and adequate charging current capabilities. However, as the display size and resolution increase, amorphous silicon TFTs will no longer be able to meet the requirements for pixel charging time (proportional to charging current) because of the low electron mobility inherent to this material.

In response to this limitation in amorphous silicon TFTs, industry is developing new technologies which use polycrystalline silicon TFTs. Unfortunately, the leakage current of these devices is significantly higher than amorphous silicon TFTs, creating a problem with charge leakage of the pixel (reverse leakage current) and, consequently, image fading. Also polycrystalline silicon represents an entirely new technology for which existing facilities must be almost completely retooled, and new processes developed to obtain economic manufacturing thereof.

Thus, there is a need in the field for a silicon TFT which has the advantages of both amorphous and polycrystalline silicon TFTs without the disadvantages of polycrystalline silicon TFTs. This need is satisfied by the present invention which involves a method which may be utilized to increase the forward current drive capability of an existing amorphous silicon TFT without adversely affecting the reverse leakage current, or being utilized in the fabrication of the silicon TFT. This is accomplished by directing pulsed energy onto a surface of the amorphous silicon to selectively heat and crystallize a top region or section of the amorphous silicon layer that comprises the channel region of the thin-film transistor. The depth of crystallization is controlled by adjusting the laser energy fluence. Thus, a shallow polycrystalline layer is formed in the amorphous silicon TFr. This accomplishment effectively extends the useful life of amorphous silicon TFT technology by many years, while satisfying the need for increased pixel charging time and thus can be utilized for flat panel display size and resolution increase. In addition, due to the short layer processing time, less expensive substrates can be utilized in the fabrication of silicon TFTs because insufficient heat is generated to damage such substrates.

SUMMARY OF THE INVENTION

It is an object of the present invention to increase the forward current drive capability of existing amorphous silicon thin-film transistors.

A further object of the invention is to provide a method by which a region of the amorphous silicon in thin-film transistors is converted to polycrystalline silicon.

A further object of the invention is to provide a method by which the drive current of amorphous silicon thin-film transistor can be increased, whereby pixels with larger capacitances can be driven at high refresh rates.

Another object of the invention is to provide a method for producing top-gate, amorphous silicon thin-film transistors with improved forward current drive, by selectively crystallizing a region of the amorphous silicon using pulsed laser processing.

Another object of the invention is to provide a top-gate, amorphous silicon thin-film transistor with a polycrystalline silicon surface channel region for enhanced forward current drive, utilizing pulsed laser processing.

Other objects and advantages of the method of the invention will become apparent from the following description and accompanying drawing. Basically, the invention involves providing an amorphous silicon thin film transistor with a polycrystalline silicon surface channel region for producing enhanced forward current drive. The method of this invention can be effectively utilized on existing amorphous silicon thin-film transistors or during the fabrication of such transistors. By increasing the forward current drive capability of amorphous silicon thin-film transistors, thus enabling applications requiring increased display size and resolution, the useful life of amorphous silicon thin-film transistors can be effectively extended. The method of this invention is carried out by directing pulsed energy, such as from a pulsed excimer laser, onto a surface of the amorphous silicon layer causing heating and crystallization of a surface region of the amorphous silicon. By use of this invention a thin-film transistor is produced which combines the advantages of both amorphous and polycrystalline silicon as materials for use, for example, in the active matrix of a flat panel liquid crystal display.

BRIEF DESCRIPTION OF THE DRAWINGS

The accompanying drawing, which is incorporated into and forms a part of the disclosure, illustrates the method of the invention and, together with the description, serves to explain the principles of the invention.

The single figure illustrates the method of this invention which utilizes a pulsed energy source to selectively heat and crystallize a top region of material in a thicker amorphous silicon film that comprises the channel region of a thin-film transistor.

DETAILED DESCRIPTION OF THE INVENTION

The invention involves improved amorphous silicon thin-film transistors (TFTs) which have increased forward current drive capability. While TFTs have various applications they are utilized extensively in flat panel displays as switches at each pixel. The device structure produced by the method of this invention can be applied to the fabrication of active-matrix substrates for most advanced types of liquid crystal displays. By increasing the drive current of an amorphous silicon TFT, pixels with larger capacities can be driven at high refresh rates. The fabrication modification provided by this invention allows displays of much larger size and resolution to be produced with existing manufacturing technologies. The invention results in a device that combines the advantages of by polycrystalline silicon and amorphous silicon as material for use, for example, in the active matrix of a flat panel liquid crystal display. The invention is based on the recognition that by using pulsed energy processing the surface channel region of an amorphous silicon TFT can be converted to polycrystalline silicon, thus enhancing the forward current drive thereof.

The invention as described hereinafter and illustrated in the drawing is directed to providing an existing top-gate, amorphous silicon thinfilm transistor with improved forward current drive. As shown in the Figure, the top-gate silicon TFT, prior to applying the method of this invention, includes a substrate 10, a bottom insulator layer 11, an amorphous silicon layer 12, and a gate insulator layer 13. The invention is carried out by directing a beam of pulsed energy, indicated at 14 through the gate insulator layer 13, which is transparent to the energy, onto the amorphous silicon layer 12 causing heating and crystallization of an upper or surface region of the amorphous silicon to form a polycrystalline silicon (polysilicon) layer 15. The pulsed energy beam 14 is produced by a pulsed energy source 16 controlled by a computer controller 17. Aside from the advantage of increasing the forward current drive capability of the amorphous silicon TFT, the use of pulsed energy to produce the polycrystalline surface channel region 15 in the amorphous silicon layer 12, the substrate 10 may be composed of so-called low-temperature plastic or glass, thus reducing the costs of the TFT. Low-temperature plastic, for example, is that which cannot withstand sustained processing temperatures of greater than about 180°–200° C. Due to the short energy pulse duration, the substrate 10 can withstand the crystallization of the upper region 15 of the amorphous silicon layer 12. The utilization of pulsed energy for forming polycrystalline silicon on low-temperature substrates is described and claimed in copending U.S. application Ser. No. 08/219,487, filed Mar. 29, 1994, entitled "Electronic Devices Utilizing Pulsed-Energy Crystallizated Microcrystalline/Polycrystalline Silicon", J. L. Kaschmitter et al., now U.S. Pat. No. 5,456,763 issued Oct. 10, 1995, and assigned to the same assignee.

The method of this invention as described above, is accomplished using a pulsed energy source, such as a pulsed excimer laser, to selectively heat and crystallize the top region or section of material in a thicker amorphous silicon layer that comprises the channel region of a thin-film transistor, as illustrated in the Figure. The pulsed excimer laser may, for example, be a 308 nm XeCl excimer laser, using a selected number of pulses of 30 nsec/pulse duration, and with an energy density of 150 mJ/cm². The depth of crystallization of the top or surface region is controlled by adjusting the laser energy fluence. A primary feature of the invention lies in setting the fluence at a level to melt, for example, the top 10 nm of silicon wherein the amorphous silicon layer has a thickness of 100 nm, for example. Controlling of the laser energy fluence is carried out by the computer controller 17, for example, of the illustrated embodiment.

The following advantages result: By restricting the melt depth in the amorphous layer the amount of energy necessary for the process is reduced by a factor of two or more. This reduces the total heat input during the process, allowing lower-melting-point substrates to be incorporated and at least doubling throughput for the laser-energy-limited process. Nevertheless, by melting the surface, the interface between the silicon and the gate insulator is smoothed and the gate insulator is densified, thereby reducing the density of the interface and the probability for pinhole defects and increasing the surface mobility in the device. The silicon in the melted region recrystallizes as larger-grained polycrystalline silicon with an attendant mobility gain of one to two orders of magnitude. At 10 nm this recrystallized region is thick enough to encompass the entire active channel region when the TET is in forward operation. Electrically, the TFT behaves as if the channel region was composed entirely of polycrystalline silicon. Thus, the current drive in the transistor is significantly increased compared to an amorphous silicon channel TFT. In reverse operation, polycrystalline silicon is inherently more leaky than amorphous silicon and is therefore not desirable as a channel material. However, in the device structure produced by this invention, only about 10 percent of the conduction path is polycrystalline silicon, with the remainder being low leakage amorphous silicon. Furthermore, the probability of a low resistance grain boundary path from the source to drain is significantly reduced, compared to a 100% polycrystalline silicon channel. As a result, the device in reverse operation looks electrically like an amorphous silicon channel TFT. In this manner the device made by the method of this invention combines the advantages of both polycrystalline and amorphous silicon as materials for use such as in the active matrix of a flat panel liquid crystal display.

By way of example, the top-gate, silicon thin-film transistor illustrated in the Figure, may comprise a substrate 10, made of polyethylene teraphthelate (PET) and having a thickness of 3 to 7 mils; the bottom insulator 11 may be made of $SiO_2$ having a thickness of 100 to 500 nm; the amorphous silicon layer 12 may initially have a thickness of 50 to 200 nm; with the polycrystalline silicon layer or region 15 having a thickness of 10 to 20 nm (a ratio of 1:10 of the amorphous silicon layer thickness); and the gate insulator 13 may be made of $SiO_2$ with a thickness of 100 to 300 nm. The pulsed energy beam 14 may be produced by the above-described 308 nm XeCl excimer laser 16, with energy pulses varying in number from 1 to 20 and time duration of 10 to 100 ns. The bottom insulator 11 may also be composed of $Al_2O3$, TaOx and SiNx, for example, and the gate insulator 13 may also be made of SiNx, $Al_2O3$, and TaOx, for example. The pulsed energy source 16 may also be a pulsed YAG laser, KrF and XeF excimer lasers, copper vapor lasers, and pulsed x-ray sources. The substrate 10, while described as a low-temperature substrate may also be composed of the so-called high-temperature materials capable of withstanding processing temperatures of up to about 800° C. However, to reduce costs, low-temperature substrates are preferred and such are defined as plastics, glass, etc. which cannot withstand sustained processing time periods (greater than $\sim 10^5$ ns) and sustained processing temperatures of greater than about 100°–200° C. In addition to PET, such plastic substrates are exemplified by polyethersulfone (PES), ethylene-chloratrifluoro-ethylene (E-CTFE), ethylene-tetra-fluoroethylene (E-TFE), polyvinylidene fluoride (PVDF), poly-teta-fluoro-ethylene (PTFE), fiberglass enhanced plastic (FEP), and high density poly-ethylene (HDPE).

The above description of the method of the invention has been set forth relative to an existing amorphous silicon thin-film transistor to modify same by forming in the amorphous silicon a polycrystalline silicon surface channel region to enhance forward current drive. However, the method of this invention can be incorporated into the manufacturing process for such thin-film transistors such that the pulsed laser processing to form the polycrystalline silicon region can be carried out prior to depositing the gate insulator, or after the insulator is deposited, depending on the transparency of the gate insulator material to the pulsed energy being directed onto amorphous silicon, such that the composition of the gate insulator does not adversely effect the melting and crystallization of the surface region of the amorphous silicon layer or create additional heating which may adversely effect the low-temperature substrate.

It has thus been shown that the present invention provides a method by which amorphous silicon TFTs are provided with improved forward current drive capabilities, thereby effectively extending the useful life of such TFTs, as well as enabling their use, for example in flat panel displays or much larger size and resolution, while allowing the fabrication thereof with existing manufacturing techniques. The invention provides an amorphous silicon TFT with a polycrystalline silicon surface channel region, and thereby results in a device which combines the advantages of both polycrystalline and amorphous silicon as materials for use such as the active matrix of a flat panel liquid crystal display.

While a particular embodiment incorporating the invention has been illustrated, and specific materials, parameters, energy sources, etc. have been set forth to explain and exemplify the invention, such are not intended to be limiting. Modifications and changes may become apparent to those skilled in the art, and it is intended that the invention be limited only by the scope of the appended claims.

I claim:

1. A method for enhancing forward current drive in an amorphous silicon thin film transistor composed of a substrate, a first insulator layer, a layer of amorphous silicon, and a second insulator layer, comprising:
   directing pulsed energy through the second insulator layer onto the top of the amorphous silicon;
   providing means for controlling energy fluence of the pulsed energy directed onto the top surface region;
   melting at least a region of only a top surface of the amorphous silicon by the pulsed energy directed thereon to a depth of about one tenth of the depth of the layer of amorphous silicon; and
   allowing the thus melted region to crystallize.

2. The method of claim 1, wherein the pulsed energy is produced by a source selected from the group of pulsed excimer lasers, copper vapor lasers, YAG lasers, and pulsed x-ray sources.

3. The method of claim 1, additionally including controlling the depth of melting by adjusting the pulsed laser energy fluence.

4. The method of claim 3, wherein the pulsed laser energy is produced by an excimer laser.

5. The method of claim 1, wherein the melting and crystallizing of the region of amorphous silicon produces polycrystalline silicon in that region.

6. The method of claim 1, wherein the top surface is melted only to a depth ratio of 1:10 of the amorphous silicon.

7. A method for fabricating an amorphous silicon thin film transistor with a polycrystalline surface channel region for enhancing forward current drive, comprising:
   providing a substrate;
   providing an insulator layer on the substrate;
   providing a layer of amorphous silicon on the insulator layer;
   providing an insulator layer over the layer of amorphous silicon;
   converting only a surface channel region of the amorphous silicon layer to polycrystalline silicon by directing controlled pulsed laser energy thereon, to a depth of about one-tenth of the depth of the amorphous silicon layer; and
   controlling the pulsed laser energy fluence.

8. The method of claim 7, wherein the controlled pulsed energy is produced by a pulsed excimer laser, and additionally controlling a depth of melting by controlling the fluence of the pulsed laser energy.

9. The method of claim 7, additionally including forming the substrate from material incapable of withstanding sustained processing temperatures greater than about 100°–200° C.

10. The method of claim 7, wherein the converting is carried out by melting the region of amorphous silicon with pulsed laser energy, and the controlling of the depth of the melting is carried out by adjusting the laser energy fluence.

11. The method of claim 7, wherein converting the surface channel region of the amorphous silicon layer to polycrystalline silicon is carried out by melting the region of amorphous silicon to a preselected depth using controlled pulsed laser energy, and allowing the melted silicon to crystallize forming polycrystalline silicon, whereby the thin film transistor is provided with a structure which contains both polycrystalline and amorphous silicon as materials for use in an active matrix of a flat panel liquid crystal display.

12. The method of claim 11, wherein the surface channel region is converted to a depth ratio of 1:10 of the amorphous silicon.

13. The method of claim 11, wherein the silicon immediately below a silicon-insulator interface is melted for providing better transistor operation.

* * * * *